(12) United States Patent
King et al.

(10) Patent No.: US 7,119,271 B2
(45) Date of Patent: Oct. 10, 2006

(54) WIDE-BANDGAP, LATTICE-MISMATCHED WINDOW LAYER FOR A SOLAR CONVERSION DEVICE

(75) Inventors: Richard Roland King, Thousand Oaks, CA (US); Peter C. Colter, Canyon Country, CA (US); James H. Ermer, Burbank, CA (US); Moran Haddad, Winnetka, CA (US); Nasser H. Karam, Northridge, CA (US)

(73) Assignee: The Boeing Company, Chicago, IL (US)

( * ) Notice: Subject to any disclaimer, the term of this patent is extended or adjusted under 35 U.S.C. 154(b) by 714 days.

(21) Appl. No.: 10/356,028

(22) Filed: Jan. 31, 2003

(65) Prior Publication Data

US 2003/0145884 A1 Aug. 7, 2003

Related U.S. Application Data

(63) Continuation-in-part of application No. 09/976,508, filed on Oct. 12, 2001, now abandoned.

(51) Int. Cl.
*H01L 31/04* (2006.01)
*H01L 21/02* (2006.01)

(52) U.S. Cl. .................. 136/252; 136/261; 136/262; 438/57

(58) Field of Classification Search ................ 136/252, 136/261, 262; 438/57
See application file for complete search history.

(56) References Cited

U.S. PATENT DOCUMENTS

| 4,255,211 A * | 3/1981 | Fraas ................... 136/249 |
| 4,935,384 A * | 6/1990 | Wanlass ................ 438/94 |
| 5,944,913 A * | 8/1999 | Hou et al. ............ 136/255 |
| 6,252,287 B1 * | 6/2001 | Kurtz et al. ........... 257/461 |

* cited by examiner

*Primary Examiner*—Nam Nguyen
*Assistant Examiner*—Anthony Fick
(74) *Attorney, Agent, or Firm*—Ostrager Chong Flaherty & Broitman P.C.

(57) ABSTRACT

A photovoltaic cell or other optoelectronic device having a wide-bandgap semiconductor used in the window layer. This wider bandgap is achieved by using a semiconductor composition that is not lattice-matched to the cell layer directly beneath it and/or to the growth substrate. The wider bandgap of the window layer increases the transmission of short wavelength light into the emitter and base layers of the photovoltaic cell. This in turn increases the current generation in the photovoltaic cell. Additionally, the wider bandgap of the lattice mismatched window layer inhibits minority carrier injection and recombination in the window layer.

21 Claims, 4 Drawing Sheets

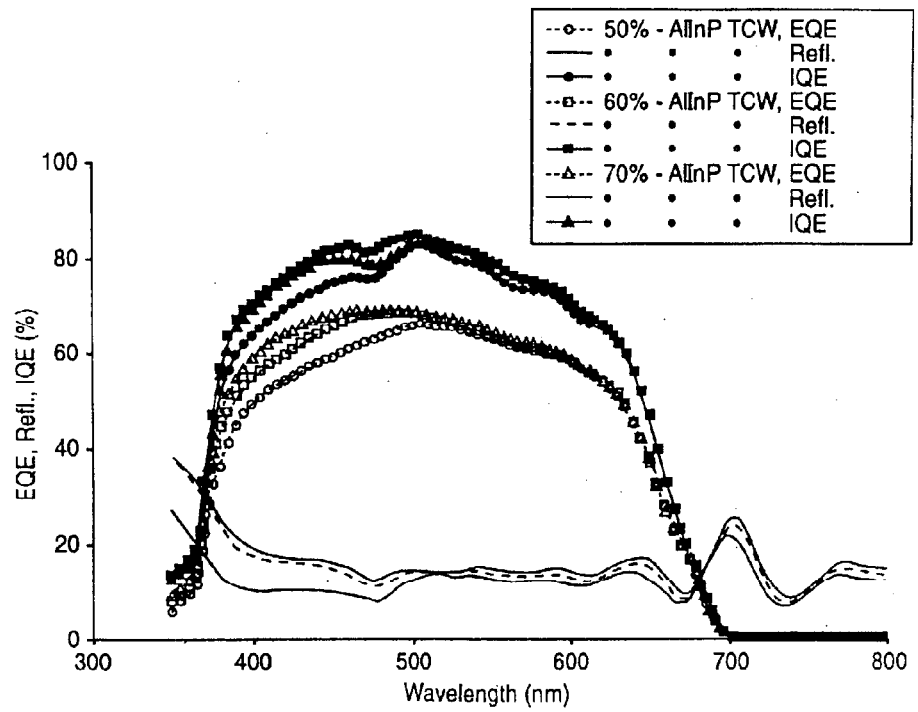

FIG. 3

| Al mole fraction x in $Al_xIn_{1-x}P$ of top cell window (%) | | | External quantum efficiency (EQE) (unitless) | | Cumulative current density $J_t + J_m$ meas. by EQE | | Efficiency calc. using $(J_t + J_m)/2$ from EQE, Voc and FF from light I-V | |
|---|---|---|---|---|---|---|---|---|
| nominal | actual | | 400 nm | 450 nm | $J_t + J_m$ (mA/cm$^2$) | Improvement (rel %) | Efficiency (abs. %) | Improvement (rel %) |
| 50% | 50.4% | Average: Upper limit: Lower limit: | 0.5075 0.52 0.50 | 0.61 0.62 0.60 | 24.465 24.74 24.18 | 0.0% | 18.20% 18.77 17.71 | 0.0% |
| 60% | 60.5% | Average: Upper limit: Lower limit: | 0.555 0.56 0.54 | 0.665 0.67 0.66 | 24.95 24.15 24.65 | 2.0% | 18.73% 19.15 18.49 | 2.9% |
| 70% | 70.6% | Average: Upper limit: Lower limit: | 0.5975 0.61 0.57 | 0.6875 0.69 0.68 | 25.155 25.33 25.00 | 2.8% | 19.00% 19.27 18.65 | 4.4% |

FIG. 4

| Al mole fraction x in Al$_x$In$_{1-x}$P of top cell window (%) | | External quantum efficiency (EQE) for AR-coated cells (unitless) | | Cumulative current density J$_t$ + J$_m$ meas. | | Efficiency calc. using (J$_t$ + J$_m$)/2 from EQE and Voc and FF from light I-V, after AR coat | | Efficiency measured by light I-V, after AR coat | |
|---|---|---|---|---|---|---|---|---|---|
| nominal | actual | 400 nm | 450 nm | J$_t$+J$_m$ (mA/cm$^2$) | Improvement (rel %) | Efficiency (abs. %) | Improvement (rel %) | Efficiency (abs. %) | Improvement (rel %) |
| 50% | 50.4% | 0.69 | 0.79 | 31.48% | 0.0% | 23.8% | 0.0% | 23.3% | 0.0% |
| 60% | 60.5% | 0.73 | 0.84 | 31.94% | 1.5% | 24.3% | 2.2% | 23.8% | 2.0% |
| 70% | 70.6% | 0.76 | 0.86 | 31.66% | 0.6% | 24.1% | 1.1% | 23.7% | 1.8% |

FIG. 6

WIDE-BANDGAP, LATTICE-MISMATCHED WINDOW LAYER FOR A SOLAR CONVERSION DEVICE

RELATED APPLICATION

This is a Continuation-In-Part of U.S. patent application Ser. No. 09/976,508, filed on Oct. 12, 2001 now abandoned.

STATEMENT REGARDING FEDERALLY SPONSORED RESEARCH

This invention was made with Government support under Contract No. F29601-98-2-0207 awarded by the United States Air Force. The Government has certain rights in this invention.

TECHNICAL FIELD

The present invention generally relates to semiconductor materials and wide-bandgap, lattice-mismatched layers for optoelectronic devices, and, more particularly, to wide bandgap, lattice-mismatched window layers for solar energy conversion and other photovoltaic devices.

BACKGROUND ART

The interest in photovoltaic ("PV") cells in both terrestrial and non-terrestrial applications continues as concerns over pollution and limited resources continue. Irrespective of the application, and as with any energy generation system, efforts have been ongoing to increase the output and/or increase the efficiency of PV cells. In terms of output, multiple cells or layers having different energy bandgaps have been stacked so that each cell or layer can absorb a different part of the wide energy distribution in the sunlight.

The prior art consists of photovoltaic cells with window layers that are nominally lattice-matched to the cell layers beneath them. The constraint of lattice matching fixes the value of the indirect and direct bandgaps of window layers composed of ternary semiconductors. Light with photon energy greater than that of the direct bandgap of the window material will be strongly absorbed in the window layer. Minority-carrier lifetimes and diffusion lengths are often low in many window materials, so that it is preferable that the window is highly transmissive, allowing light to reach the cell emitter and/or base layers beneath the window, where photogenerated carriers can diffuse to the collecting junction more easily before recombining. Therefore, relatively low bandgaps available in lattice-matched window materials are a disadvantage, since they lead to strong absorption of light in the window where it is not used efficiently.

SUMMARY OF THE INVENTION

The present invention consists of a wide bandgap semiconductor used in the window layer of a photovoltaic cell. This wider bandgap is achieved by using a semiconductor composition that is not lattice-matched to the cell layer directly beneath it and/or to the growth substrate. The wider bandgap of the window layer increases the transmission of short wavelength (referred to as "blue") light into the emitter and base layers of the photovoltaic cell. This in turn increases the current generation in the cell.

These wide-bandgap, lattice-mismatched window layers may be used in single-junction or multijunction solar cells, as the window layer of the top subcell of a multijunction cell, or in a lower subcell in the multijunction cell stack. The wide-bandgap, lattice-mismatched window layers may be used in a homojunction cell, or in a heterojunction cell in which the window layer also serves as the cell emitter.

Additional possible benefits of the present invention include improved surface passivation at the interface of the window, as well as enhanced light trapping effects and increased optical path length that allow thinner photogeneration regions in the cells with greater radiation resistance and/or lower growth times and costs. Other possible benefits are the effect of strain and/or lattice mismatched composition on: 1) the group-III sublattice disording in semiconductors used for the window which increases the bandgap even at the same composition and strain, 2) the transport of point defects and impurities from the cap layer and other layers above the window layer, as well as the transport of point defects and impurities from the emitter layer and other layers below the window layer, and 3) the incorporation of impurities such as oxygen.

BRIEF DESCRIPTION OF THE DRAWINGS

FIG. 3 is a graph plotting external quantum efficiency and internal quantum efficiency at various wavelengths for the top subcell window of FIG. 2 having a range of aluminum mole fractions;

FIG. 4 is a table associated with FIGS. 2 and 3;

FIG. 6 is a table associated with FIGS. 2 and 5.

BEST MODES FOR CARRYING OUT THE INVENTION

Single-Junction Photovoltaic Cells

It is understood that the term "lattice mismatched" refers to the intentional mismatching of material lattice constants between layers of the photovoltaic devices described herein. The term "lattice mismatched," as one of ordinary skill appreciates, is substantially different than "lattice matched" or "nearly lattice matched." Also, the term "material lattice constant" refers to the lattice constant of the material in a free-standing layer (i.e. when the material is "relaxed" or "fully relaxed"). In addition, the term "lattice mismatch" of a first layer with respect to a second layer is defined as the difference between the material lattice constant of the first layer and the material lattice constant of the second layer divided by the material lattice constant of the second layer. The term "lattice mismatched," as one of ordinary skill appreciates, has a greater degree of mismatch and is thus substantially different than "lattice matched" or "nearly lattice matched." Further, the term "lattice-mismatched" is defined as having a difference in the material lattice constants between respective layers of the photovoltaic devices of greater than approximately 1.0%.

Figure 1:
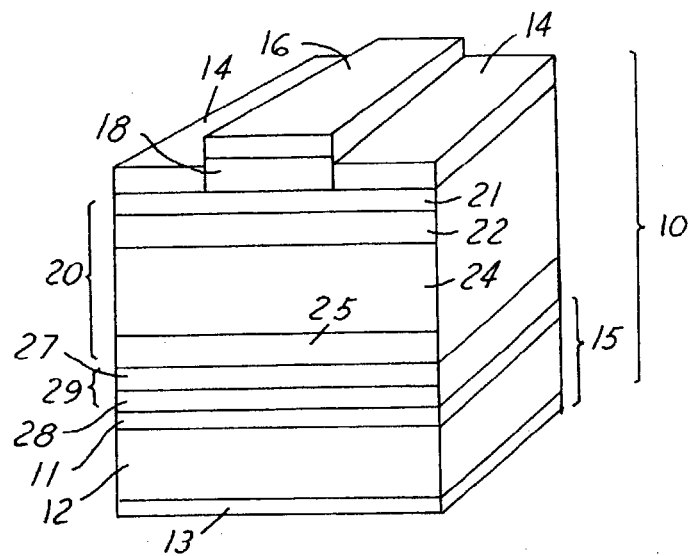
FIG. 1 is a cross-section of a single-junction photovoltaic cell according a preferred embodiment of to the present invention.

FIG. 1 shows a cross-section of a photovoltaic cell 20 in a single-junction photovoltaic structure 10 representing a preferred embodiment of the present invention, having an photovoltaic cell window 21 that is lattice-mismatched with respect to the photovoltaic cell emitter 22 on which it is deposited, and to the other semiconductor layers in the solar cell, such as the base 24, and the back-surface field (BSF) layer 25. As a result, the lattice-mismatched window 21 can have a semiconductor composition that allows the window to have a higher bandgap, and hence to be more transmissive to light, than a conventional window that is lattice-matched to the emitter beneath.

The photovoltaic cell 20 (and each subcell in a multifunction cell) is composed of an emitter layer 22 of a first doping type and a base layer 24 of a second doping type. For instance, if the emitter layer 22 is n-type, then the base layer 24 is typically p-type; and if the emitter layer 22 is p-type, then the base layer 24 is typically n-type, such that a p-n junction is formed between the emitter layer 22 and base layer 24. There may be variations in the doping concentration in the emitter 22 and/or base layers 24, typically with higher doping toward the front of the emitter layer 22 and lower doping in the portion of the emitter layer 22 that is closer to the p-n junction, and higher doping toward the back of the base layer 24 and lower doping in the portion of the base layer 24 that is closer to the p-n junction, in order to suppress minority-carrier concentration at the surfaces away from the p-n junction, and enhance minority-carrier flow toward the collecting p-n junction. The base layer 24 may be intrinsic or not-intentionally-doped (nid) over part or all of its thickness.

In addition to the basic components of the emitter layer 22 and base 24, a photovoltaic cell (and each subcell in a multijunction cell) typically includes a window layer on top of the emitter, and a back-surface field (BSF) layer on the back of the base. The window layer typically has the same doping type as the emitter, often has a higher doping concentration than the emitter, and it is desirable for the window layer to have a higher bandgap than the emitter, in order to suppress minority-carrier photogeneration and injection in the window, thereby reducing the recombination that would otherwise occur in the window. It is also highly desirable for the window layer 21 to form an interface with the emitter layer 22 with as few minority carriers and as few deep energy levels in the bandgap as possible that could participate in Shockley-Read-Hall (SRH) recombination at the interface. Since crystal defects can cause these deep energy levels, the window layer 21 should be capable of forming an interface with the emitter layer 22 that has as few crystal defects as possible. This property of the window layer 21 of minimizing minority-carrier recombination at the emitter layer 22 surface is referred to as emitter passivation. Passivation is a term that has various meanings depending on the context in which it is used, but in this text it will be used to have the above meaning unless otherwise noted.

The photovoltaic cell 20 also typically has an anti-reflection (AR) coating 14 on its front (sunward) surface, typically made up of one, two, or more dielectric layers with thicknesses optimized to maximize transmission of light through the front surface over the range of wavelengths to which the photovoltaic cell 20 is responsive. The photovoltaic cell 20 typically has structures that allow it to be electrically connected to an external circuit and/or to additional subcells in a multijunction cell. The overall photovoltaic cell structure 10 complete with contacting layers shown in FIG. 1 includes a heavily-doped cap contacting layer 18 on top of the window layer 21 of the photovoltaic cell 20, and a metal contact 16 on top of the cap layer 18. The contacting layers on the bottom of the photovoltaic cell 20 may include a heavily-doped semiconductor layer contacted by a metal layer, or a tunnel junction 29 used to connect the photovoltaic cell 20 to a buffer layer 15, a nucleation layer 11, a growth substrate 12, and a bottom contact layer 13. The tunnel junction 29 is preferably composed of a heavily-doped $p^{++}$ semiconductor layer 27 and a heavily-doped $n^{++}$ semiconductor 28.

Note that a variety of different semiconductor materials may be used for these lattice-mismatched, wide-bandgap window 21, emitter 22, base 24 and/or BSF 25 layers, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention. Additionally, while the growth substrate 12 is preferably a Ge growth substrate, other semiconductor materials may be used as the growth substrate 12. These include, but are not limited to, GaAs, InP, GaSb, InAs, InSb, GaP, Si, SiGe, SiC, $Al_2O_3$, Mo, stainless steel, soda-lime glass, and $SiO_2$.

In the preferred embodiment of FIG. 1, the photovoltaic cell window 21 is an AlInP photovoltaic cell window, the base 24 is a GaInP base, and the back-surface field (BSF) layer 25 is a AlGaInP back-surface field layer.

The emitter layer 22 is typically thinner than the base layer 24 and positioned on the sunward side of the base layer 24, though some specialized cells also make use of back surface illumination incident on the back of the base. Most of the photogeneration of electron-hole pairs responsible for the cell current typically takes place in the base layer 24, though the photogenerated current density from the emitter layer 22 is also significant in the emitter layer 22, and in some specialized cells may exceed that in the base layer 24.

The photovoltaic cell 20 may be of either a homojunction or heterojunction design. In a homojunction design, the semiconductor material in the emitter layer and base layer has the same composition, with the exception of the different doping in the emitter layer 22 and base layer 24. In a heterojunction design, the semiconductor material in the emitter layer 22 has a different composition than that of the base layer 24, in addition to the different doping types in the emitter layer 22 and base layer 24. The emitter layer 22 composition in a heterojunction photovoltaic cell design is typically chosen such that the emitter layer 22 has a higher bandgap than the base layer 24, in order to inhibit injection of the majority carriers in the base layer 24 into the emitter layer 22 (where they are minority carriers that can recombine, since the emitter layer 22 and base layer 24 are of opposite doping type), and in order to transmit more light through the emitter layer 22 to the base layer 24 before the light is absorbed to create electron-hole pairs.

In some specialized cells, a thin, often intrinsic layer (not shown) may be placed between the emitter layer 22 and base layer 24, which may have the same composition as either the emitter layer 22 and/or the base layer 24, or may have a composition that is distinct from either. This thin layer at the p-n junction, often called an 'intrinsic layer' if it is undoped, can serve to suppress shunting at the p-n junction, and can reduce the interface state density at the p-n junction in order to suppress minority-carrier recombination in the space-charge region. Similar to the base layer 24, the emitter layer 22 may also be intrinsic or not-intentionally-doped (nid) over part or all of its thickness, but if this intrinsic or nid region is positioned adjacent to the p-n junction, it is typically considered part of the base layer 24 or as a separate 'intrinsic layer', described above, between the base layer 24 and emitter layer 22.

The BSF layer 25 is analogous to the window layer 21 in that the BSF layer 25 passivates the base layer 24 of the photovoltaic cell 20. The BSF layer 25 typically has the same doping type as the base layer 24, often has a higher doping concentration than the base layer 24, and it is desirable for the BSF layer 25 to have a higher bandgap than the base layer 24, to suppress minority-carrier photogeneration and injection in the BSF layer 25, and to reduce recombination in the BSF layer 25.

In one preferred embodiment of the present invention shown in FIG. 1, the window layer 21 of the photovoltaic cell 20 is designed to have a wider bandgap, by virtue of its composition that is lattice-mismatched to the emitter layer 22 (and to the rest of the photovoltaic cell layers), than the bandgap would be for a lattice-matched window layer 21. For example, a lattice-mismatched window layer 21 composed of AlInP with approximately 60% Al mole fraction may be used, i.e., $Al_{0.60}In_{0.40}P$ (referred to in this text as 60%-AlInP), having a lattice constant that is 1.0% smaller than that of a GaInP emitter layer 22 lattice-matched to a Ge growth substrate and base layer 12 (having a composition of $Ga_{0.505}In_{0.495}P$), to achieve a higher bandgap than would be possible with a conventional lattice-matched window composed of AlInP having 50% Al mole fraction. The lattice-mismatched, high-bandgap, 60%-AlInP window layer 21 is significantly more transmissive than the conventional lattice-matched, lower-bandgap 50%-AlInP window, allowing the photovoltaic cell 20 to have a higher photogenerated current in the emitter layer 22 and base layer 24, where carriers can be efficiently collected, thus increasing the output current, electrical power, and efficiency of the cell 20.

In general, this preferred embodiment of the present invention as shown in FIG. 1 consists of a single-junction photovoltaic cell, for which the window layer 21 of the cell 20 is lattice-mismatched to the epitaxial layers 18, 21, 22, 27, 11 and growth substrate layer 12 beneath it, and has a higher bandgap than would a window layer composed of the same elements (i.e., a window composed of the same material system) that has a composition which is lattice-matched to the epitaxial layers and the substrate beneath it. Both the extreme cases of a lattice-mismatched window layer 21 that is fully strained (pseudomorphic) and free of dislocations, and the case of a lattice-mismatched window layer 21 that is relaxed (unstrained) due to dislocations that have formed in the layer 21 to accommodate the lattice mismatch, as well as the continuum of intermediate states of strain, relaxation, and dislocation density between these two extreme cases, are considered to be covered by the present invention, and by the term "lattice-mismatched window layer 21." The lattice-mismatched window layer 21 is considered to be a "wide-bandgap" window if its bandgap is higher than that of the lattice-matched composition of the same semiconductor material system used for the window, including any effects of the strain state of the window layer on the bandgap.

By definition, when a lattice-mismatched layer is grown on a substrate, the strain $\epsilon_{(parallel)}$ is defined as the difference between the lattice constant of a material parallel to the growth plane $a_{L(parallel)}$ and the material lattice constant of the material $a_L$ divided by the material lattice constant of the material $a_L$, also expressed as $(\epsilon_{(parallel)}=[a_{L(parallel)}-a_L]/a_L)$. Thus, an epitaxial layer is said to be 100% (fully) relaxed (or 0% strained), if the lattice constants in both the growth plane $a_{L(parallel)}$, and in the growth direction, $a_{L(perpendicular)}$, is equal to its material lattice constant. Stated another way, the strain $\epsilon_{(parallel)}$ in a 100% relaxed epitaxial layer is zero. A mismatched epitaxial layer is said to be 100% (fully) strained (0% relaxed) if its lattice constant in the plane of the layer surface is equal to that of the substrate. Stated another way, the strain $\epsilon_{(parallel)}$ is essentially equal to the lattice mismatch, defined as $([a_L-a_S]/a_S)$. Thus, it is understood by those of ordinary skill that the epitaxial layers may move between fully relaxed and fully strained as the lattice constant of the epitaxial layer moves between the material lattice constant of the epitaxial layer and the material lattice constant of the substrate.

The wider bandgap of the window layer 21 in the single-junction cell 10 depicted in FIG. 1 increases the transmission of light with short wavelengths into the emitter 22 and base 24 layers of the photovoltaic cell 20, thus increasing the current that can be collected from the cell 20. Light with short wavelengths in this context refers to light on the short-wavelength end of the wavelength range to which the cell is responsive. This short wavelength range is often referred to as the "blue" portion of the spectral response, although the actual wavelengths referred to in this way may or may not actually correspond to blue light. The different composition and/or the different strain state of the lattice-mismatched window layer 21 may, in some cases, also improve the surface passivation (reduction of surface minority-carrier recombination) of the cell emitter layer 22 beneath the window layer 21.

Normally, the layers that make up a photovoltaic solar cell are designed to be lattice-matched to maintain a high degree of crystalline quality of the semiconductor layers. The presence of such crystal defects reduces the minority-carrier lifetimes in the bulk of the cells, increases the surface recombination velocity at interfaces, and creates possible shunting paths, all of which can reduce the current and voltage of photovoltaic devices, increase the reverse saturation current density and diode ideality factor of p-n junction in the device, and in general, degrade the performance of optoelectronic devices.

Therefore, it is not obvious to purposely lattice-mismatch one or more of the cell layers, including the window layer 21. However, since the window layer 21 is usually not heavily relied upon for collection of photogenerated current within the volume of the window, a high concentration of defects can be tolerated in the layers grown after the window layer 21 as well. In addition, the window layer 21 is often very thin, so some degree of lattice-mismatch can be tolerated in the window layer 21 by distortion of the crystal lattice without forming crystal defects in a pseudomorphic window layer.

These wide-bandgap, lattice-mismatched semiconductor layers may be used as the window layer 21 in a homojunction cell as depicted in FIG. 1, or in a heterojunction cell in which the emitter layer 22 has a different composition than the cell base layer 24, as the window layer 21 above the heterojunction emitter.

In another preferred embodiment, the emitter layer 22 is composed of a wide bandgap, lattice-mismatched semiconductor material forming a heterojunction emitter, such that the wide bandgap, lattice-mismatched semiconductor material has an interface with the cell base 24. In this embodiment, the wide bandgap of the lattice-mismatched emitter layer 22 benefits the cell performance by increasing the transmittance of light to the base 24 of the cell 20. This is desirable because minority-carrier collection is typically more efficient in the base 24 than in the emitter layer 22 of typical solar cell designs. The wide bandgap of the lattice-mismatched emitter layer 22 also benefits cell performance by reducing minority-carrier injection into the emitter layer 22 from the base 24. The different composition and/or the different strain state of the lattice-mismatched heterojunction emitter layer 22 may, in some cases, also improve the surface passivation (reduce surface minority-carrier recombination) at the interface between the lattice-mismatched heterojunction emitter 22 and the cell base 24.

In another preferred embodiment of the present invention, the BSF layer 25 may be composed of a lattice-mismatched semiconductor composition as well, either with a conventional lattice-matched window, or in combination with a lattice-mismatched wide-bandgap window 21, in order to increase the bandgap of the BSF layer 25, reducing injection of minority carriers from the base layer 24 into the BSF layer 25 where the minority-carrier lifetime is low. The lower absorption and higher transmission of light in the lattice-mismatched wide-bandgap BSF layer 25 can be beneficial as well, in the case of a thin base subcell of a multijunction cell, to increase photogenerated current density in subcell beneath the BSF layer, and avoid photogeneration in the BSF layer where carriers are more likely to recombine.

Note that a variety of different semiconductor materials may be used for these lattice-mismatched emitter and/or lattice-mismatched BSF layers, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention.

Multijunction Photovoltaic Cells

Figure 2:
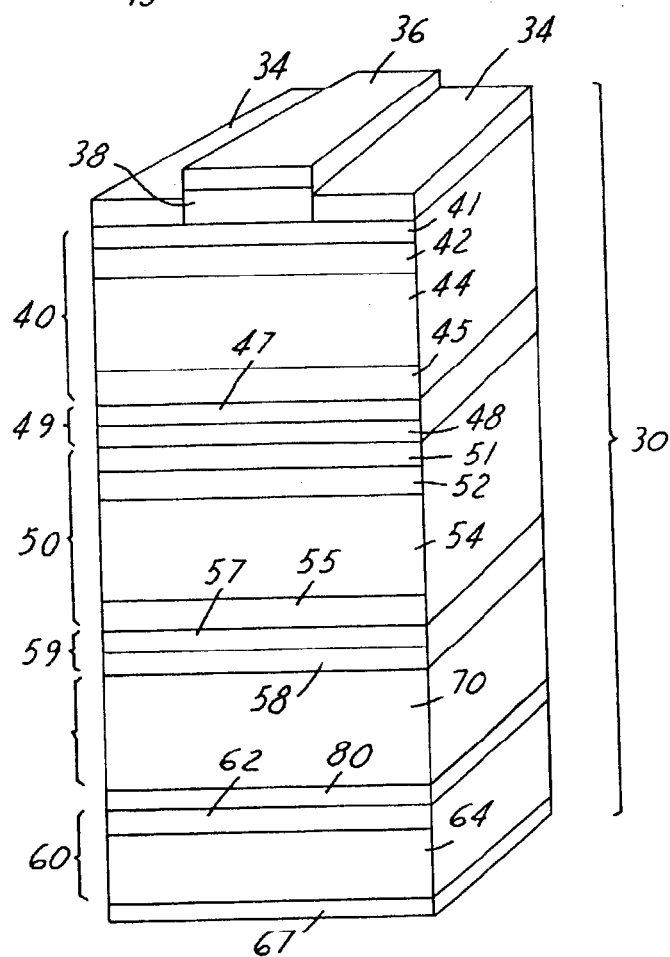
FIG. 2 is a cross-section of a multijunction photovoltaic cell according to a preferred embodiment of the present invention.

The wide-bandgap, lattice-mismatched window of FIG. 1 may be used in any or all of the subcells in a multijunction (MJ) photovoltaic cell. FIG. 2 depicts a cross-section of a MJ cell 30 representing one preferred embodiment of the present invention having three subcells, 40, 50, and 60, connected in electrical series, in which the top subcell 40 has a wide-bandgap, lattice-mismatched window 41. The subcells 40, 50, 60 that form the MJ cell 30 are referred to according to the material of their respective base layer 44, 54, 64. For instance, in FIG. 2, the multijunction cell 30 is preferably composed of a GaInP subcell 40 with a GaInP base layer 44, a Ga(In)As subcell 50 with a Ga(In)As base layer 54 (where the parentheses around In indicate that the base may be composed of GaInAs or GaAs), and a Ge subcell 60 with a Ge base layer 64 composed of a Ge growth substrate.

The subcells 40, 50, 60 may also be referred to by the order in which light strikes each subcell as it enters the front of the MJ cell 30. For instance in FIG. 2, the subcell 40 may also be referred to as the top subcell or subcell 1, the subcell 50 may be referred to as the middle subcell or subcell 2, and the Ge subcell 60 as the bottom subcell or subcell 3. In general, n subcells may be connected in series, where n may be equal to 1 for a single-junction cell, or n may be any integer greater than or equal to 2 for a multifunction cell. The growth substrate may be electrically inactive, or, it may be electrically active, thereby forming one of the n subcells in the multijunction cell.

For example, in FIG. 2, the Ge subcell 60 is formed from the germanium wafer that serves as a substrate for epitaxial growth of the semiconductor layers that form the upper subcells, and as the main mechanical support for the cell, in addition to serving as one of the three active subcells in the 3-junction cell 30. The epitaxial growth of semiconductor layers on the substrate is typically initiated with a nucleation layer 80, and a buffer region 70, which may contain one or more semiconductor layers, is typically grown between the nucleation layer 80 and the lowermost epitaxial subcell (in FIG. 2, this is the middle cell 50). The tunnel junction between the lowermost subcell and the substrate may be placed either above, beneath, or in the body of buffer region 70. In FIG. 2, the tunnel junction 59 is shown above the buffer region 70.

A tunnel junction 49 connects the top subcell 40 and the middle subcell 50 in electrical series, and another tunnel junction 59 connects the middle subcell 50 and the bottom subcell 60 in electrical series. In general, each of the n subcells in a MJ cell 30 may be connected in series to the adjacent subcell(s) by a tunnel junction, in order to form a monolithic, two-terminal, series-interconnected multijunction cell. In this two-terminal configuration it is desirable to design the subcell thicknesses and bandgaps such that each subcell has nearly the same current at the maximum power point of the current-voltage curve of each subcell, in order that one subcell does not severely limit the current of the other subcells. Alternatively, the subcells may be contacted by means of additional terminals, for instance, metal contacts to laterally conductive semiconductor layers between the subcells, to form 3-terminal, 4-terminal, and in general, m-terminal MJ cells where m is an integer greater than or equal to 2 (the case of m=2 is the special case of the two-terminal series-interconnected cell described above), and less than or equal to 2n, where n is the number of active subcells in the MJ cell. The subcells can be interconnected in circuits using these additional terminals such that most of the available photogenerated current density in each subcell can be used effectively, leading to high efficiency for the MJ cell, even if the photogenerated current densities are very different in the various subcells.

The window, emitter, base, and BSF layers are shown in each of the subcells 40, 50, and 60 in FIG. 2. The window, emitter, base, and BSF layers in the top cell 40 are layers 41, 42, 44, and 45, respectively, and in the middle cell 50 they are layers 51, 52, 54, and 55, respectively.

As shown in FIG. 2, the nucleation layer 80 also serves as a window layer for the bottom cell 60. The buffer region 70 can also be considered as part of the window of the Ge subcell 60, though it has other functions as well, such as reducing crystal defects and improving morphology in the upper epitaxially-grown layers of the MJ cell 30. The emitter layer 62 of the Ge subcell 60 in FIG. 2 is formed by diffusion into the p-type Ge substrate of column-V elements (which are n-type dopants in Ge) from the epitaxial growth of the III–V semiconductors on top of the Ge substrate. The base 64 of the Ge subcell 60 consists of the bulk of the p-type Ge wafer which also serves as the growth substrate and mechanical support for the rest of the MJ cell 30. No BSF layer is shown at the back of the Ge subcell 60 in FIG. 2. However, a BSF layer such as a diffused p$^+$region, or an epitaxially-grown group-IV or III–V semiconductor layer, on the back of the Ge subcell 60 is certainly an option in MJ cell technology, and would also help to improve the efficiency of the Ge subcell 60, as well as the overall MJ cell 30 efficiency.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 40 in FIG. 2 are the cap layer 38 on the front of the subcell 40 (which in turn is contacted by the metal grid pattern 36 on the top of the MJ cell 30), and the p$^{++}$-doped side 47 of the tunnel junction 49 on the back surface of the top subcell 40. The contacting layers for the middle subcell 50 in FIG. 2 are the n$^{++}$-doped side 48 of the tunnel junction 49 on front of the middle subcell 50, and the p$^{++}$-doped side 57 of the tunnel junction 59 on the back surface of the middle subcell 50. The contacting layers for the Ge bottom subcell 60 in FIG. 2 are the n$^{++}$-doped side 58 of the tunnel junction 59 on front of the buffer region 70 (provided that the buffer region 70 is considered to be part of the window structure for the Ge subcell 60), and the back metal contact 67 on the back surface of the bottom subcell 60 (which is also the back surface of the entire MJ cell 30).

The contacting layers may be unpatterned, as in the case of the back metal contact 67 on the bottom subcell 60, or a transparent conductive oxide contacting the top cell emitter 42, in place of the more conventional solar cell grid. The contacting layers may also patterned, as in the case of the patterned heavily-doped cap 38 and metal contact 36 that form the front grid of most solar cells, as shown in FIG. 2.

The lateral conductivity of the emitter and window layers between gridlines is important, since after minority-carriers in the base (minority electrons in the case of the p-type top cell base shown in FIG. 2) are collected at the base/emitter p-n junction between the gridlines, the collected carriers, which are now majority carriers in the emitter (majority electrons in the n-type top cell emitter in FIG. 2), must be conducted to the gridlines with minimum resistive loss. Both the top cell emitter layer 42 and window layer 41 take part in this lateral majority-carrier conduction to the gridlines. While maintaining this high conductivity, the window 41 and emitter layers 42 must remain highly transmissive to photon energies that can be used effectively by the base 44 of the top cell 40 and by the other active subcells 50, 60 in the MJ cell 30, and/or have a long diffusion length for minority-carriers that are photogenerated in the window 41 and emitter layers 42 (minority holes in the case of the n-type emitter shown in FIG. 2), so that they may be collected at the p-n junction before recombining. Since the transmittance and diffusion length both tend to decrease for high doping levels, an optimum doping level typically exists at which cell efficiency is maximized, for which the conductivity of the window 41 and emitter layer 42 is high enough that resistive losses are small compared to the power output of the cell 40, and yet the transmittance and minority-carrier collection in the window 41 and emitter layer 42 are high enough that most of the photons incident on the cell 40 generate useful current.

The highly-doped layers that form the tunnel junctions between cells, with their very low sheet resistance, also serve as lateral conduction layers, helping to make the current density across the MJ cell 30 more uniform in the case of spatially non-uniform intensity or spectral content of the light incident on the cell. Laterally-conductive layers between the subcells 40, 50, and on the back of the bottom cell 60, are also very important in the case of MJ cell designs which have more than two terminals, for instance, in mechanically-stacked or monolithically-grown MJ cells with 3, 4, or more terminals in order to operate the subcells at current densities that are not all necessarily the same, in order to optimize the efficiency of each subcell and hence of the entire MJ cell. Laterally-conductive regions between the subcells 40, 50 and at the back of the bottom cell 60 are also important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

Note that a variety of different semiconductor materials may be used for the wide bandgap lattice-mismatched window layer 41, the window layers 51, 80, the emitter layers 42, 52, 62, the base layers 44, 54, 64 and/or the BSF layers 45, 55, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention. Additionally, while the growth substrate and base layer 64 is preferably a p-Ge growth substrate and base layer, other semiconductor materials may be used as the growth substrate and base layer 64, or only as a growth substrate. These include, but are not limited to, GaAs, InP, GaSb, InAs, InSb, GaP, Si, SiGe, SiC, Al$_2$O$_3$, Mo, stainless steel, soda-lime glass, and SiO$_2$.

In the preferred embodiment shown in FIG. 2, the window layer 41 of the GaInP top subcell 40 consists of a wide-bandgap AlInP window layer 41 that is not lattice-matched to the GaInP emitter layer 42 of the top subcell 40 directly beneath it, to the other epitaxially-grown layers in the MJ cell, or to the Ge growth substrate and to the Ge subcell 60. The lattice constant of the window layer 41 is designed to be less than the lattice constant of the GaInP emitter layer 42 (and of the other epitaxially-grown layers in the MJ cell, and the Ge growth substrate and to the Ge subcell 60), in order to increase the bandgap of the window layer 41 above that of the lattice-matched composition of AlInP.

In general, this preferred embodiment of the present invention consists of a MJ cell 30 with 2 or more active photovoltaic subcells, for which the window layer 41 of the top cell 40 is lattice-mismatched to the epitaxial layers and substrate 64 beneath it, and has a higher bandgap than would a window composed of the same elements (i.e., a window composed of the same material system) that has a composition which is lattice-matched to the epitaxial layers and the substrate beneath it, including any effects of the strain state of the window layer on the bandgap. As for the embodiment described earlier with a lattice-mismatched window layer 21 used on a single-junction cell 10, the lattice-mismatched window 41 in the multijunction cell of FIG. 2 may be fully strained (pseudomorphic), fully relaxed, or have any strain state between these extreme cases.

These wide-bandgap, lattice-mismatched window layers may be used in single-junction or multijunction solar cells, as the window layer 41 of the top subcell 40 of a multijunction cell 30, as the window layer of a lower cell in the multijunction cell stack, or as the window layer of combination of subcells in the multijunction cell. Similarly, these lattice-mismatched, wide-bandgap layers may be used as the emitter layer of any subcell or any combination of subcells, or as the BSF layer of any subcell or combination of subcells. The lattice-mismatched window layers, lattice-mismatched emitter layers, and/or lattice-mismatched BSF layers may be used in combination with each other in the same single-junction photovoltaic subcell, the same subcell of a multijunction cell, in different subcells of a multijunction cell, or in different regions of other optoelectronic devices. In general, other layers of the multijunction cell may also be composed of these lattice-mismatched layers, such as cap layers, buffer layers, nucleation layers, tunnel junction layers, intrinsic layers between base and emitter, base layers, and partial thicknesses of window, emitter, BSF, or any of the above types of photovoltaic cell layers, particularly where the wider bandgap of the lattice mismatched layer increases transmission of light to lower layers of the cell and/or reduces recombination in that region of the cell.

In another family of embodiments, the wide-bandgap, lattice-mismatched layers described above may be used in optoelectronic and electronic devices other than photovoltaic cells. In one embodiment, the wide-bandgap, lattice-mismatched layer may be used on the front (light-receiving) surface of a light sensor, such as a p-i-n diode or avalanche photodiode (APD), in order to transmit more light through to the collecting regions of the sensor, and/or to reduce recombination at the front surface. In another embodiment, a wide-bandgap, lattice-mismatched layer may be used as the emitter or collector on a heterojunction bipolar transistor (HBT), in order to reduce minority-carrier injection into the emitter from the base, reduce recombination at the base-emitter interface, or increase breakdown voltage across the base-collector junction. In another embodiment, a wide-bandgap, lattice-mismatched layer may be used as a window layer on a light-emitting diode (LED) or vertical-cavity surface-emitting laser (VCSEL), to reduce minority carrier recombination at the surface, and increase transmittance of light out of the device. In another embodiment, a wide-bandgap, lattice-mismatched layer may be used as the barrier layer or layers around a quantum well, as in a quantum well laser, in order to produce a deeper quantum well and thereby to confine carriers in the quantum well more effectively, and to effect the strain state and bandgap of the quantum well, and to passivate the interface between the quantum well and the barrier. In another embodiment, a wide-bandgap, lattice-mismatched layer may be used as the cladding layer or layers for a semiconductor laser, to confine carriers more effectively in the vicinity of the lasing region, and to provide a lower index of refraction in the cladding layers in order to achieve a greater degree of total internal reflection. In another embodiment, a wide-bandgap, lattice-mismatched layer may be used in Bragg reflector layers of alternating low- and high-index-of-refraction layers, as used in VCSELs and other devices.

FIG. 3 shows the measured external quantum efficiency (EQE), reflectance, and internal quantum efficiency (IQE) of a device incorporating the embodiment of the present invention having a wide-bandgap, lattice-mismatched window layer on the top subcell of a multijunction cell 30 having a similar structure as in FIG. 2. The introduction of a wide-bandgap, lattice-mismatched AlInP window layer 21 above the GaInP emitter 22 in the GaInP top subcell 20 of a 2-junction GaInP/1%-In GaInAs solar cell grown on a Ge substrate (corresponding to window layer 41, emitter layer 42, and GaInP top subcell 40 in FIG. 2) is demonstrated to result in significantly improved EQE and IQE in the 375–500 nm range ('blue' response), resulting in higher multijunction cell currents and efficiencies. The 2-junction solar cell devices represented in FIG. 3 have a structure similar to the cell cross-section in FIG. 2, except that the Ge substrate 64 is n-type, and hence the Ge subcell has no p-n junction and is inactive, and the cells have no AR coating. The cells for which experimental data are shown in FIG. 3 have a range of aluminum (Al) compositions, and therefore have a range of bandgaps and of lattice-mismatches to the GaInP emitter.

The IQE plotted in FIG. 3 is calculated from the measured EQE and reflectance, and is normalized so that the highest value for all three window conditions of the sum of IQE values for the cell 1 (top cell) and cell 2 has a maximum of 100%. The window layer 41 compositions range from 50%-Al AlInP ($Al_{0.5}In_{0.5}P$) (nominally lattice-matched to the top cell emitter 42, representing the prior art), to 60%-Al AlInP ($Al_{0.6}In_{0.4}P$) and 70%-Al AlInP ($Al_{0.7}In_{0.3}P$), exhibiting increasing bandgap and increasing tensile strain in the lattice-mismatched window 41 as the aluminum composition increases. The direct bandgap for relaxed (unstrained) AlInP with these compositions of 50%-, 60%-, and 70%-Al increases from approximately 2.48 to 2.69 to 2.91 eV, respectively. The lattice constant for relaxed layers with these compositions decreases from 5.6575 to 5.6181 to 5.5763 angstroms, respectively, as the aluminum content increases.

As shown in FIG. 3, much higher levels of response are seen for the 60% and 70%-Al AlInP in the 375–500 nm range than in the 50%-Al AlInP window layer 41 in IQE as well as EQE, indicating that the improvement is not solely a change in reflectance due to the different Al compositions, but is primarily due to the lower absorption of the lattice-mismatched window layers 41. The direct bandgaps of various AlInP compositions affect the absorptance much more strongly than the indirect gap for these thin window layers. The wavelength of a photon with energy corresponding to the 2.48 eV direct bandgap of relaxed 50%-Al AlInP is 500 nm, while that corresponding to the 2.69 eV direct bandgap of 60%-Al AlInP is 461 nm, and that corresponding to the 2.91 eV of 70%-Al AlInP is 426 nm. The much higher bandgaps of the lattice-mismatched window layers 41 are responsible for their greater transmittance of short wavelength light to the active GaInP emitter layer 42 and active GaInP base layer 44 below.

Further, as indicated in the table in FIG. 4, the cumulative current density for the wavelength spectrum, defined as the sum of the short current density of the top cell $J_T$ and the short circuit current density of the middle cell $J_M$ as calculated by integrating the measured EQE of each cell over the wavelength spectrum, increased 2% for the 60%-Al AlInP window and 2.9% for the 70%-Al AlInP window compared to the 50%-Al AlInP reference window. Also, the cell efficiencies, calculated using $V_{OC}$ and FF from light I–V measurements with an XT-10 solar simulator and using the cumulative current densities divided equally among the top and middle cells, increased 2.9% for the 60%-Al AlInP window and 4.4% for the 70%-Al AlInP window compared to the 50%-Al AlInP reference window.

Figure 5:
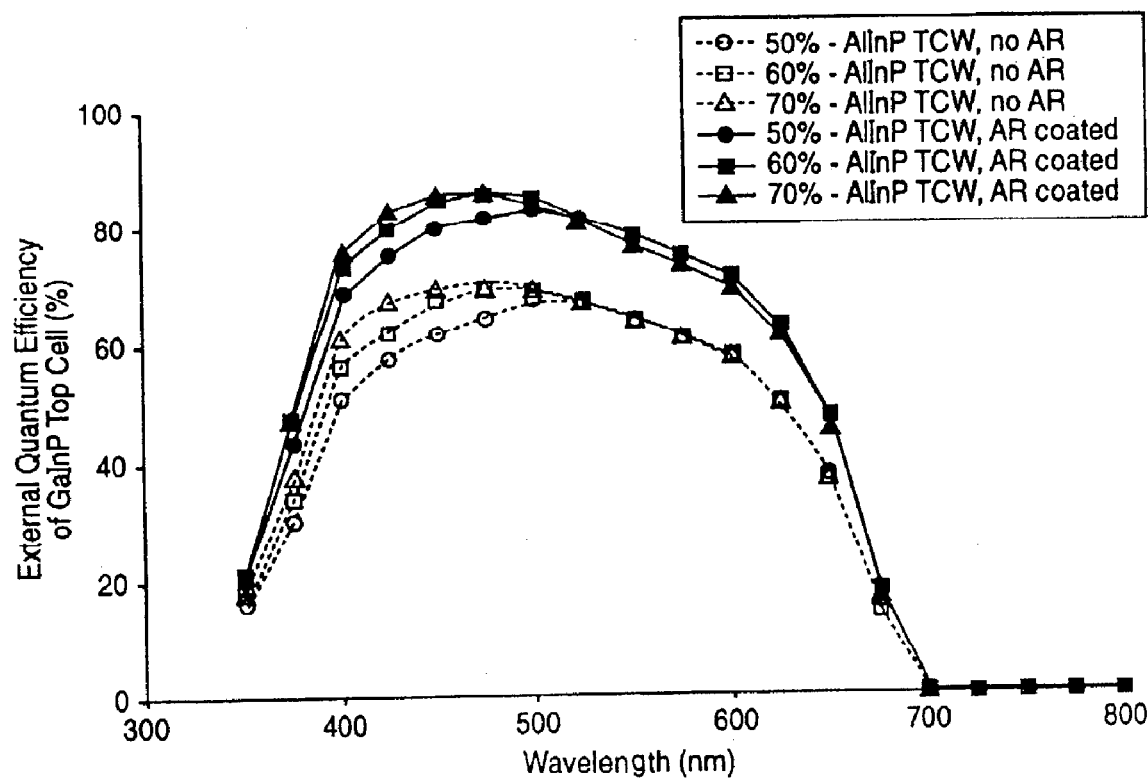
FIG. 5 is a graph plotting external quantum efficiency and internal quantum efficiency at various wavelengths for the top cell window of FIG. 2 having a range of aluminum mole fractions and an anti-reflective coating.

Referring now to FIG. 5, the measured EQE of the GaInP top cell 40 in a 2-junction GaInP/1%-In GaInAs cell grown on a Ge substrate is depicted both with and without an AR coating, for an experiment using the same window layer 41 compositions as in FIGS. 3 and 4. Here, as above in FIG. 3, the EQE was shown to be much higher for the lattice-mismatched window layers 41 than in the prior art. The higher responses are seen not only for cells without AR coating, but also after the AR coating 34 is deposited, further indicating that the improved quantum efficiency is not solely due to reduced reflectance of the Al-rich lattice-mismatched window layers 41, but is primarily due to reduced parasitic absorptance in the higher-Al window layers 41, and/or lower surface recombination velocity at the interface between the top cell window layer 41 and emitter.

As seen in the table in FIG. 6, the cumulative current density for the wavelength spectrum after AR coating increased 1.5% for the 60%-Al AlInP window and 0.6% for the 70%-Al AlInP window compared to the 50%-Al AlInP reference window. Also, the cell efficiencies, calculated using $V_{OC}$ and FF from light I–V measurements with an XT-25 solar simulator and using the cumulative current densities divided equally among the top and middle cells, increased 2.2% for the 60%-Al AlInP window and 1.8% for the 70%-Al AlInP window compared to the 50%-Al AlInP reference window.

Further, the increase in cell efficiency as measured directly by light I–V measurements with the X25 solar simulator (that is, using the currents measured under the solar simulator rather than the integrated current from quantum efficiency measurements) is 2.0 relative percent for the 60%-Al AlInP window and 1.8 relative percent for the 70%-Al AlInP window. The 2.0 relative percent increase in efficiency that results for the 60%-Al AlInP, strained top window can be expected to increase a 27.0% efficient cell with a standard, unstrained 50%-Al AlInP TCW to 27.5% efficiency. Further increases may be possible by optimizing the AR coat to account for the different optical properties and enhanced blue response of cells with the 60%-Al AlInP, strained top window.

Benefits of the present invention include improved surface passivation at the interface of the window layer, as well as enhanced light trapping effects and increased optical path length due to scattering by dislocations in a relaxed or partially relaxed lattice-mismatched window, that allow thinner photogeneration regions in the cells with greater radiation resistance and/or lower growth times and costs. Other possible benefits are the effect of strain and/or lattice mismatched composition on: 1) the group-III sublattice disordering in semiconductors used for the window layer which increases the bandgap even at the same composition and strain, 2) the transport of point defects and impurities from the cap layer and other layers above the window layer, 3) the transport of point defects and impurities from the emitter, base, BSF, tunnel junction and other layers below the window layer, and 4) the incorporation of impurities such as oxygen.

While the invention has been described in terms of preferred embodiments, it will be understood, of course, that the invention is not limited thereto since modifications may be made by those skilled in the art, particularly in light of the foregoing teachings.

What is claimed is:

1. A photovoltaic cell comprising:
  at least one subcell, at least one of said at least one subcells having an emitter layer, said emitter layer composed of a first material having a first material lattice constant;
  and a lattice-mismatched window layer positioned directly adjacent to said emitter layer, wherein the lattice-mismatched window layer is composed of a second material having a second material lattice constant wherein said first material lattice constant and said second material lattice constant differ in material lattice constant values by at least greater than approximately 1.0%, wherein said lattice mismatched window layer is fully relaxed with respect to said emitter layer by virtue of dislocations in the crystal structure of said lattice mismatched window layer.

2. The photovoltaic cell of claim 1, wherein said second material lattice constant of said lattice mismatched window layer is less than said first material lattice constant.

3. The photovoltaic cell of claim 1, wherein said second material lattice constant of said lattice mismatched window layer is greater than said first material lattice constant.

4. The photovoltaic cell of claim 1, wherein the composition of said lattice-mismatched window layer is selected from the group consisting of AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, and CdSSe.

5. The photovoltaic cell of claim 1, wherein the photovoltaic cell is a single-junction photovoltaic cell.

6. The photovoltaic cell of claim 1, wherein the photovoltaic cell is a multijunction photovoltaic cell.

7. The photovoltaic cell of claim 1, wherein said emitter layer is a heterojunction emitter layer.

8. The photovoltaic cell of claim 1, wherein said emitter layer is a homojunction emitter layer.

9. The photovoltaic cell of claim 1 further comprising a bottom subcell located below said at least one subcell, said bottom subcell having a base layer composed of a growth substrate.

10. The photovoltaic cell of claim 1 further comprising one or more layers of an anti-reflection coating optically coupled to said lattice-mismatched window layer.

11. A photovoltaic cell comprising: at least one subcell, at least one of said at least one subcells having an emitter layer and a base layer, said base layer composed of a first material having a first material lattice constant;
  wherein said emitter layer is a heterojunction emitter layer composed of a second material, said second material having a second material lattice constant that is not equal to said first material lattice constant and wherein said first material lattice constant and said second material lattice constant differ in material lattice constant values by at least greater than approximately 1.0%, wherein said base layer is fully relaxed with respect to said emitter layer by virtue of dislocations in the crystal structure of said base layer.

12. The photovoltaic cell of claim 11 further comprising a lattice-mismatched window layer positioned directly adjacent to said heterojunction emitter layer, wherein said lattice-mismatched window layer is composed of a third material, said third material having a third material lattice constant that is not equal to said second material lattice constant and wherein said third material lattice constant and said second material lattice constant differ in material lattice constant values by at least greater than approximately 1.0%.

13. The photovoltaic cell of claim 11 further comprising a window layer positioned directly above said heterojunction emitter layer, wherein said window layer is composed of a third material, said third material having a third material lattice constant that is not equal to said second material lattice constant and wherein said third material lattice constant and said second material lattice constant differ in material lattice constant values by at least greater than approximately 1.0%.

14. The photovoltaic cell of claim 11, wherein the composition of said heterojunction emitter layer is selected from the group consisting of AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, and CdSSe.

15. A photovoltaic cell comprising: at least one subcell, at least one of said at least one subcells having an emitter layer and a base layer and a BSF layer, said base layer composing a second material having a second lattice constant;
  wherein said BSF layer is composed of a first material, said first material having a first material lattice constant that is not equal to said second material lattice constant and wherein said BSF layer is lattice mismatched by a material lattice constant value of at least greater than approximately 1.0% to said base layer, wherein said BSF layer is fully relaxed with respect to said base layer by virtue of dislocations in the crystal structure of said BSF layer.

16. The photovoltaic cell of claim 15, wherein the composition of said at least one BSF layers is selected from the group consisting of AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, and CdSSe.

17. A photovoltiac cell comprising: at least one subcell, at least one of said at least one subcells having an emitter layer and a base layer; and a lattice mismatched window layer positioned directly adjacent to said emitter layer, wherein said lattice mismatched window layer is composed of a first material, said first material having a first material lattice constant that is not equal to a second material lattice constant of a second material composing said emitter layer and is not equal to a third material lattice constant of a third material composing said base layer, wherein said first material lattice constant and said second material lattice constant differ in material lattice constant values by at least approximately 1.0% and wherein said first material lattice constant and said third material lattice constant differ in material lattice constant values by at least greater than approximately 1.0%, wherein said lattice mismatched window layer is fully relaxed with respect to said emitter layer by virtue of dislocations in the crystal structure of said lattice mismatched window layer.

18. A method for increasing current generation in a photovoltaic cell or other optoelectronic device, the method comprising the steps of: providing at least one subcell layer, wherein at least one of said at least one subcell layers has an emitter layer; and growing a lattice-mismatched window layer positioned directly adjacent to said emitter layer, wherein the lattice-mismatched window layer is composed of a first material, said first material having a first material lattice constant that is not equal to a second material lattice constant of a second material composing said emitter layer and wherein said first material lattice constant and said second material lattice constant differ in material lattice constant values by at least greater than approximately 1.0%, wherein said lattice mismatched window layer is fully relaxed with respect to said emitter layer by virtue of dislocations in the crystal structure of said lattice mismatched window layer.

19. The method of claim 18 further comprising the step of introducing an anti-reflection coating composed of one or more layers to a top surface of said lattice mismatched window layer.

20. The method of claim 18, further comprising the step of providing a bottom cell having a bottom cell base layer composed of a portion of a growth substrate, wherein said first material lattice constant is not equal to a third material lattice constant of a third material composing said bottom cell base layer and wherein said first material lattice constant and said fourth material lattice constant differ in material lattice constant values by at least greater than approximately 1.0%.

21. The method of claim 18, wherein the photovoltaic cell or other optoelectronic device is selected from the group consisting of a space photovoltaic cell, a terrestrial photovoltaic cell, a single-junction photovoltaic cell, a multijunction photovoltaic cell, a non-concentrator photovoltaic cell, a concentrator photovoltaic cell, a homojunction photovoltaic cell, a heterojunction photovoltaic cell, a light detector, and an optoelectronic device.

* * * * *